United States Patent
Singhal

(10) Patent No.: US 6,853,574 B2
(45) Date of Patent: Feb. 8, 2005

(54) REDUCING LEAKAGE CURRENT IN CIRCUITS IMPLEMENTED USING CMOS TRANSISTORS

(75) Inventor: Vipul Singhal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 10/329,379

(22) Filed: Dec. 27, 2002

(65) Prior Publication Data

US 2004/0125637 A1 Jul. 1, 2004

(51) Int. Cl.[7] ........................... G11C 17/00; G11C 16/04
(52) U.S. Cl. .................. 365/104; 365/189.01; 365/229
(58) Field of Search ............................ 365/104, 189.01, 365/229, 228

(56) References Cited

U.S. PATENT DOCUMENTS

| | | | | |
|---|---|---|---|---|
| 3,761,799 A | * | 9/1973 | Shuey ........................ 323/270 |
| 5,051,620 A | * | 9/1991 | Burgin ........................ 326/97 |
| 6,255,853 B1 | * | 7/2001 | Houston ...................... 326/98 |
| 6,308,312 B1 | * | 10/2001 | Houston ...................... 716/17 |
| 6,314,041 B1 | * | 11/2001 | Frey ........................... 365/229 |
| 6,519,178 B2 | * | 2/2003 | Alvandpour et al. ........ 365/154 |

* cited by examiner

*Primary Examiner*—Anh Phung
(74) *Attorney, Agent, or Firm*—Robert D. Marshall, Jr.; W. James Brady, III; Frederick J. Telecky, Jr.

(57) ABSTRACT

Reducing leakage current when a circuit contains a series of CMOS transistors. The probability that each input signal (connecting to the gate terminal of the corresponding CMOS transistor) will be at a logical value which turns off the corresponding CMOS transistor is determined. A CMOS transistor with a high threshold voltage may be connected to receive an input signal with a high probability to reduce the aggregate leakage current in the circuit. The approach may be used in any environments such as synthesis tools and also manual design methodologies.

14 Claims, 3 Drawing Sheets

REDUCING LEAKAGE CURRENT IN CIRCUITS IMPLEMENTED USING CMOS TRANSISTORS

BACKGROUND OF THE INVENTION

1. Field of the Invention

The present invention relates to integrated circuits, and more specifically to a method and apparatus for reducing leakage current in circuits implemented using complementary metal oxide silicon (CMOS) transistors.

2. Related Art

Complementary metal oxide silicon (CMOS) transistors are often used to implement integrated circuits as is well known in the relevant arts. One problem with typical CMOS transistors is that a small amount of current may flow through the transistors from a power source even when the transistors are in an off state. Such flow is often referred to as leakage, the corresponding current is referred to as leakage current. In several environments (e.g., in portable applications), it is generally desirable to reduce the leakage current, for example, to minimize overall power consumption.

Various approaches are known in the prior art to reduce leakage current. In one approach, the leakage current is reduced by increasing a threshold voltage (Vt) of a CMOS transistor. As is well known, Vt represents a minimum voltage level, applied between a gate terminal and a source terminal of the transistor, below which the drain-to-source current substantially equals zero.

One problem with such an approach is that the switching speed of transistors having high threshold voltage, is generally low, thereby leading to integrated circuits with low throughput performance (measure of how quickly an output signal is generated in response to corresponding input signal). Accordingly, such an approach may be undesirable in several environments.

Accordingly, in one alternative approach, cells containing CMOS transistors (often) all of low Vt ("low Vt transistors") are used on critical paths and cells containing CMOS transistors all of high Vt ("high Vt transistors") are used elsewhere in CMOS circuits. As a critical path refers to a path offering a long(est) delay, the use of low Vt transistors reduces the delay in the critical path, thereby potentially increasing the throughput performance of the circuit. In addition, the leakage current is reduced due to the use of high Vt transistors elsewhere in the circuit.

When a cell designed with all high Vt transistors is included in a path to reduce leakage, the resulting higher delay (caused by the cell) may cause other paths containing the cell to become critical paths (which violate the timing requirements at a desired high speed of operation of an integrated circuit). Such a situation may require cells in these other paths to be designed with low Vt transistors, which again increases the aggregate leakage current in the entire integrated circuit.

In another approach, a high Vt transistor may be introduced in a path connecting a CMOS transistor to the power supply. When the circuit is in a non-operational mode (e.g., standby or sleep mode), the high Vt transistors are switched off which causes the transistors to be disconnected from power supply. Thus, the leakage current may be reduced at least in such non-operational modes. One problem with such an approach is the requirement of more high Vt transistors and the resulting potential problem with additional space and/or routing requirements.

What is therefore needed is a method and apparatus for reducing leakage current in circuits implemented using CMOS transistors while addressing one or more of the problems noted above.

SUMMARY OF THE INVENTION

The present invention allows reduction of aggregate leakage current in an integrated circuit containing a series of transistors. In an embodiment, a probability that an input signal will be at a logical value (e.g., 0 for NMOS transistors and 1 for PMOS transistors) which turns off a corresponding transistor, is determined for each input signal of a cell (e.g., a logic gate). The aggregate current leakage is reduced by ensuring that a first transistor (contained in the series of transistors) with a high threshold voltage receives an input signal with a high associated (determined) probability.

The first transistor stays off for a substantial amount of time due to the high probability (of the input signal being at a value which turns off the first transistor), and has minimal leakage current due to the high threshold voltage. As the transistors are connected in series, the aggregate current leaked by a cell (containing all the transistors together) is limited by the leakage current of the first transistor when the first transistor is in an off state. As the first transistor is in an off-state for a long time and as the first transistor has minimal leakage current, the aggregate leakage of all the transistors together (and thus of an integrated circuit) may be reduced by using the present invention.

Thus, a cell may be designed to contain transistors with different (high and low) Vt values, and the transistors with low Vt may be placed in critical paths and the remaining transistors operate to reduce leakage current. As a result, a high frequency of operation for an integrated circuit can be attained while reducing the leakage current. In addition, the time to design an integrated circuit meeting throughput performance and (reduction of) leakage current requirements may also be minimized by using the approach(es) according to various aspects of the present invention.

The above approach can be used in several environments. For example, a designer may manually (possibly using appropriate design tools) implement a circuit using the approach. Alternatively, the approach may be used to automate some of the circuit designs.

In an embodiment, a synthesis tool is implemented to use the above noted approach. A cell library, with a plurality of versions of a first cell containing a series of transistors, may be provided to the tool. The versions may differ in the use of high threshold voltage (Vt) for the transistors. The tool may receive a probability value associated with each of the input signals (connected to the gate terminals of the transistors), with the probability value representing a probability that the corresponding input signal will be at a logical value which turns off a corresponding transistor.

The tool may determine multiple options for said integrated circuit, with different options containing different versions of the first cell and/or the transistors receiving different input signals. The tool may also include a cost portion in a cost formula, with the cost portion being defined as a function of a threshold voltage of each transistor and the probability value for the corresponding input signal. The tool computes a total cost for each option according to the cost formula and selects an option with optimal (maximum, minimum, etc.) cost. As noted above, the option specifies the specific version of the cell and the specific manner in which input signals are to be connected to different transistors. Thus, the selected option with the optimal cost specifies the specific version of a transistor and also the specific input signals to be connected to the specific transistors.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

An aspect of the present invention reduces the leakage current in CMOS circuits by ensuring that a first transistor (among a series of transistors) with a high threshold voltage (Vt) is connected to receive an input signal which has a high probability of being at a logical value which turns off the first transistor. The first transistor stays off for a substantial amount of time due to the high probability (of the input signal to the first transistor being at a value which turns off the first transistor), and has minimal leakage current due to the high Vt.

As the transistors are connected in series, the aggregate current leaked by all the transistors together is limited by the leakage current of the first transistor when the first transistor is in an off state. As the first transistor is in an off-state for a long time and as the first transistor has minimal leakage current, the aggregate leakage of all the transistors together (and thus of an integrated circuit) may be reduced by using the present invention.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Circuit

Figure 1:
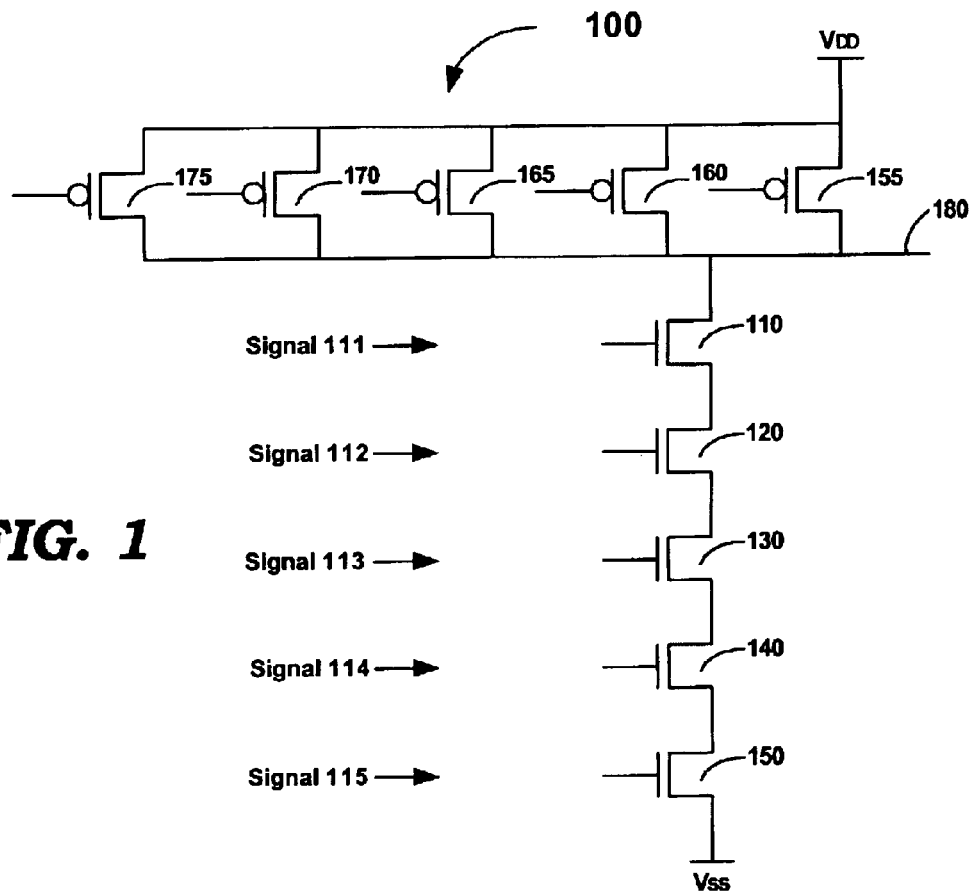
FIG. 1 is a circuit diagram containing the details of a NAND gate illustrating an example embodiment in which the present invention can be implemented.

FIG. 1 is a circuit diagram of NAND gate 100 (an example of a cell) illustrating an example circuit in which the present invention can be implemented. NAND gate 100 is shown containing five NMOS transistors 110, 120, 130, 140 and 150, and five PMOS transistors 155, 160, 165, 170, and 175. Each component is described below.

Only the details of CMOS technology as relevant to an understanding of the embodiments of the present applications is described here for conciseness. For further details of CMOS, the reader is referred to a book entitled, "Principles of CMOS VLSI Design: A Systems Perspective", Second Edition, By Neil H. E. Weste and Kamran Eshraghian, ISBN Number: 0-201-53376-6, which is incorporated in its entirety herewith.

PMOS transistors 155, 160, 165, 170, and 175 are connected in parallel between supply $V_{DD}$ and path 180. NMOS transistors 110, 120, 130, 140, and 150 are connected in series between path 180 and $V_{SS}$. Due to the nature of CMOS technology, leakage currents may be present in all the transistors, and thus in NAND gate 100.

FIG. 1 is shown further containing five input signals 111 through 115, with each input signal being intended for connection to an NMOS transistor and a PMOS transistor. The amount of time different input signals are at logical 0 (which turns of the NMOS transistors) can be different. The present invention takes advantage of such a feature in the context of transistors in series to reduce the aggregate leakage current in NAND gate 100 as described below in further detail.

3. Method

Figure 2:
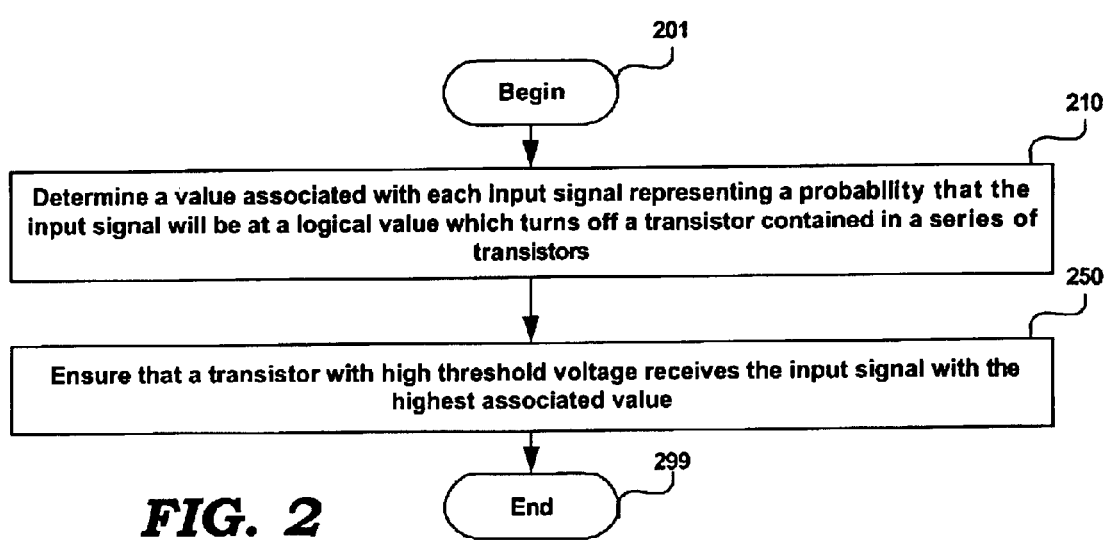
FIG. 2 is a flowchart illustrating a method to reduce leakage current according to an aspect of the present invention.

FIG. 2 is a flowchart illustrating a method using which the aggregate leakage current may be reduced in integrated circuits containing a series of CMOS transistors according to an aspect of the present invention. The method is described with reference to FIG. 1 for illustration. However, the method can be implemented in other embodiments without departing from the scope and spirit of the present invention, as will be apparent to one skilled in the relevant arts by reading the disclosure provided herein. The method begins instep 201 in which control passes to step 210.

In step 210, a value associated with each input signal is determined. The value represents a probability that the input signal will be at a logical value which turns off a corresponding transistor contained in a series of transistors. The values for the input signals (111 through 115) may be determined using one of several approaches, as noted below.

In an embodiment, NAND gate 100 is viewed (e.g., by simulation) as being implemented in a product (or any block containing the circuit) receiving several external inputs. By assigning specific logical states to the external inputs (e.g., using a data file) over time, the values/probabilities associated with the input signals may be determined. Alternatively, each external input may be assigned a specific probability of being in a specific logical state (for simplicity, equal probability of being in each of 0 and 1), and the corresponding probabilities associated with the input signals may be determined theoretically.

In step 250, it is ensured that a transistor with high threshold voltage (Vt) receives the input signal with a high (or highest, if possible in view of other considerations) associated value. Such ensuring may be achieved in different ways depending on the specific environment. For example, assuming that it is determined that input signals 111 through 115 will be respectively connected to NMOS transistors 110, 120, 130, 140, and 150 and that input signal 113 is determined to have a highest associated value, transistor 130 may be implemented with a high Vt. Alternatively, assuming that transistor 140 has the highest Vt and the input signal 111 has the highest associated value, the input signals may be routed to connect input signal 111 to the gate terminal of NMOS transistor 140. Control then passes to step 299, in which the method ends.

While the approach of above illustrates the manner in which leakage current can be minimized in an integrated circuit, typical designs require several other considerations to be balanced as well. For example, the input signal having the highest associated value may be in a critical path of the integrated circuit. Accordingly, it may be desirable to use a low Vt transistor to receive such an input signal, and use high Vt for a transistor receiving an input signal having the next highest value (a high value). Such approaches may be used in a synthesis as described below with reference to FIG. 3.

4. Synthesis Tool

Figure 3:
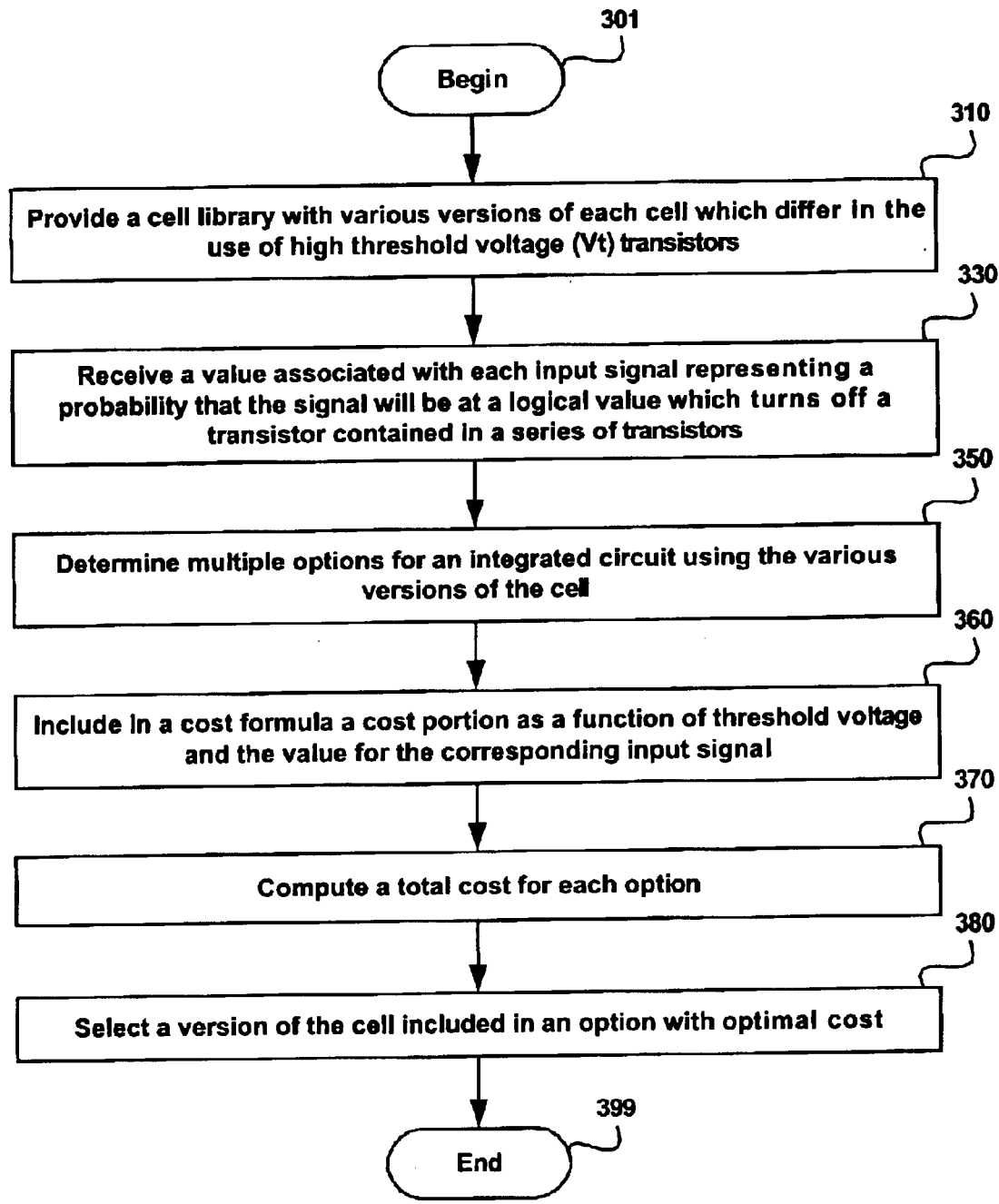
FIG. 3 is a flowchart illustrating the manner in which a synthesis tool may be implemented according to an aspect of the present invention.

FIG. 3 is a flowchart illustrating the manner in which a synthesis tool may be implemented according to an aspect of the present invention. The method begins in step 301 in which control passes to step 310.

In step 310, a cell library is provided with various versions of the same cell (e.g., NAND gate 100) which differ in the use of high threshold voltage transistors contained in a series of transistors. For example, one version of a cell may be provided to contain one high threshold voltage transistor and another version of the same cell may be provided to contain two threshold voltage transistors, etc.

In step 330, a value associated with each input signal is received representing a probability that the input signal will be at a logical value which turns off a transistor contained in the series of transistors. The values may be determined by an external source or the synthesis tool itself, for example, as noted above with reference to step 210.

In step 350, multiple options are determined for an integrated circuit using various versions of the cell. In general, an integrated circuit contains many cells. A version corresponding to each cell is selected to form an option of the integrated circuit. Options may be generated based on various priorities set by a user. For example, if a user indicates that minimizing leakage current is desirable, options may include versions of NAND gate 100, in which input signals with high associated values are connected to transistors having high Vt.

In addition, the same version of a cell may be designed to receive different input signals on different input terminals to form different options. For example, with reference to FIG. 1, assuming the threshold voltages for transistors 120 and 130 are different in one version of NAND gate 100, in one option inputs 112 and 113 may respectively be connected to the gate terminals of transistors 120 and 130, and in another option inputs 113 and 112 may respectively be connected to the gate terminals of transistors 120 and 130.

In step 360, a cost portion is included in a cost formula, with the cost portion being defined as a function of threshold voltage and the value for the corresponding input signal. Assuming that it is desirable to minimize total cost according to the cost formula, if it is desirable to minimize leakage current, the cost portion needs to evaluate to a smaller value if a transistor with high Vt would be connected to an input signal with high associated value.

In step 370, the total cost for each option is computed according to the cost formula. In step 380, an option, and thus a version of the cell contained in the option, with an optimal total cost (least cost in the above example) is selected. As a result, using an appropriate cost formula, various requirements may be balanced in a synthesis tool. Control then passes to step 399, in which the method ends.

Several aspects/steps described above may be implemented in the form of a software to quickly perform various tasks described above. An example environment in which the present invention may be implemented is described below with reference to FIG. 4.

5. Example Environment

Figure 4:
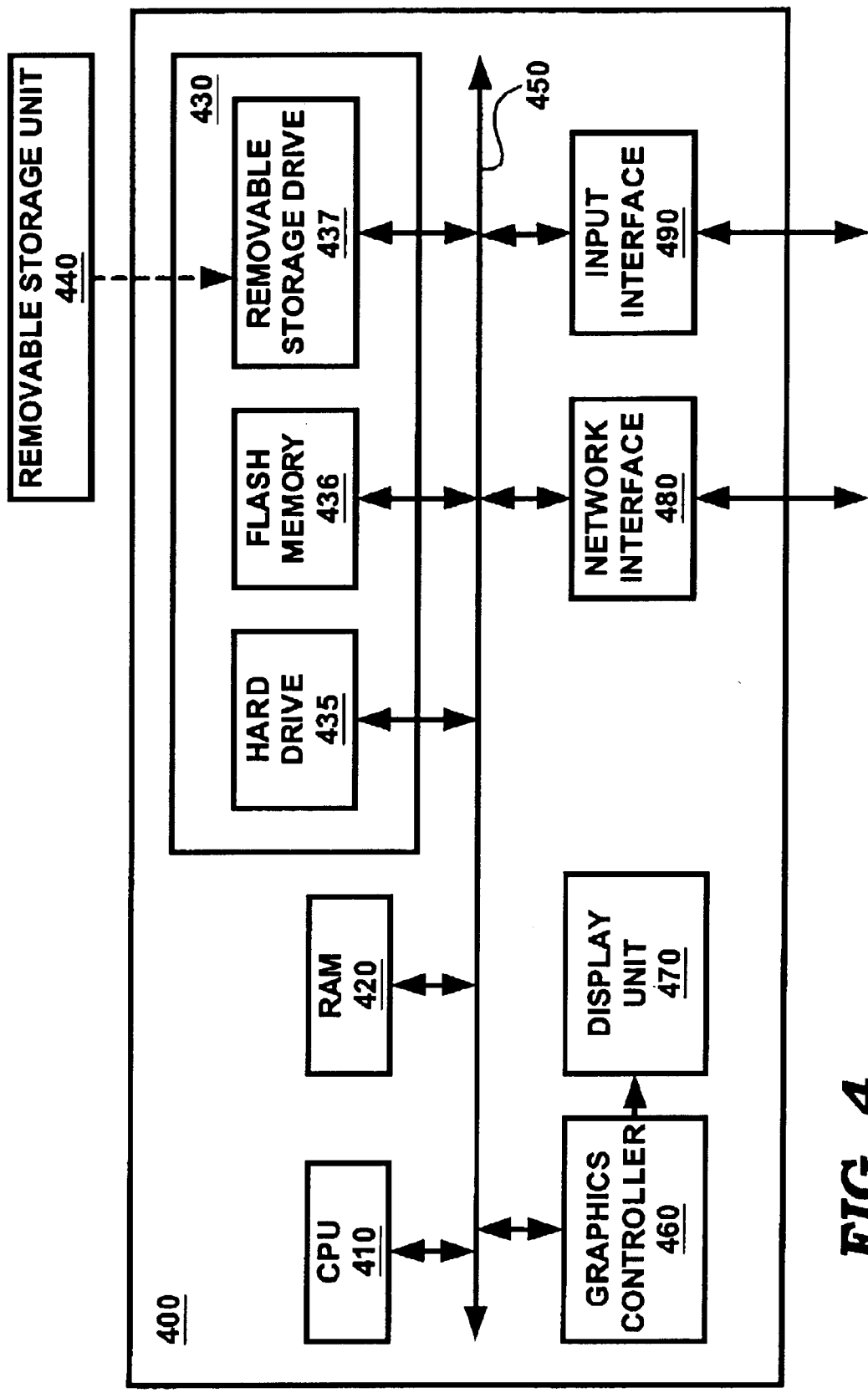
FIG. 4 is a block diagram of a computer system illustrating an example environment for implementing various aspects of the present invention.

FIG. 4 is a block diagram of computer system 400 illustrating an example environment for implementing various aspects of the present invention. Even though computer system 400 is described with specific components and architectures for illustration, it should be understood that the present invention may be implemented in several other types of embodiments.

Computer system 400 may contain one or more processors such as central processing unit (CPU) 410, random access memory (RAM) 420, secondary memory 430, graphics controller 460, display unit 470, network interface 480, and input interface 490. All the components except display unit 470 may communicate with each other over communication path 450, which may contain several buses as is well known in the relevant arts. The components of FIG. 4 are described below in further detail.

CPU 410 may execute instructions stored in RAM 420 to provide several features of the present invention. CPU 410 may contain multiple processing units, with each processing unit potentially being designed for a specific task. Alternatively, CPU 410 may contain only a single processing unit. RAM 420 may receive instructions from secondary memory 430 using communication path 450.

Graphics controller 460 generates display signals (e.g., in RGB format) to display unit 470 based on data/instructions received from CPU 410. Display unit 470 contains a display screen to display the images defined by the display signals. Input interface 490 may correspond to devices such as key-board, mouse, and various interfaces (e.g., RS-232, USB) which enables various types of data (e.g., Vt value for a transistor) to be provided from an external source.

Network interface 490 may be implemented using protocols such as TCP/IP, ATM and/or Ethernet. In an embodiment, network interface 480 and/or input interface 490 enable data to be received from an external source. The data thus received may be processed by CPU 410 by executing various instructions to provide various features of the present invention.

Secondary memory 430 may contain hard drive 435, flash memory 436 and removable storage drive 437. While secondary memory 430 is shown contained within computer system, alternative embodiments may be implemented in which secondary memory 430 is provided in an external server, and computer system 400 merely access the data and/or instructions within network interface 490.

Secondary storage 430 may store the software instructions and data (e.g., cell library, values associated with input signals), which enable computer system 400 to provide several features in accordance with the present invention. Some or all of the data and instructions may be provided on removable storage unit 440, and the data and instructions may be read and provided by removable storage drive 437 to CPU 410. Floppy drive, magnetic tape drive, CD-ROM drive, DVD Drive, Flash memory, removable memory chip (PCMCIA Card, EPROM) are examples of such removable storage drive 437.

Removable storage unit 440 may be implemented using medium and storage format compatible with removable storage drive 437 such that removable storage drive 437 can read the data and instructions. Thus, removable storage unit 440 includes a computer usable storage medium having stored therein computer software and/or data. An embodiment of the present invention is implemented using software running (that is, executing) in computer system 400.

In this document, the term "computer program product" is used to generally refer to removable storage unit 440 or hard disk installed in hard drive 435. These computer program products are means for providing software to computer system 400. As noted above, CPU 410 may retrieve the software instructions from such computer readable mediums, and execute the instructions to provide various features of the present invention. The features of the present invention are described above in detail.

6. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of reducing leakage integrated circuit containing a series of transistors and a corresponding number of input signals, said method comprising:

determining a value associated with each of said input signals, each value representing a probability that the corresponding input signal will be at a logical value which turns off a corresponding transistor contained in said series of transistors; and ensuring that a transistor with a high threshold voltage receives an input signal with a high associated value, wherein said input signal is comprised in said input signals and said transistor is comprised in said series of transistors.

2. The method of claim 1, wherein said logical value equals 1 when said transistor comprises a PMOS transistor, and equals 0 when said transistor comprises a NMOS transistor.

3. The method of claim 1, wherein said transistor is implemented with a high threshold voltage before said determining, wherein said ensuring comprises routing said input signal to be coupled to a gate terminal of said transistor.

4. The method of claim 1, wherein said ensuring comprises implementing said transistor with a high threshold voltage.

5. The method of claim 1, wherein said threshold voltage comprises a highest threshold voltage of the threshold voltages of said series of transistors.

6. The method of claim 1, wherein said integrated circuit is designed for implementation in a block, said block receiving a plurality of external inputs, wherein said determining comprises:

associating a second probability for each of said plurality of external inputs, wherein said second probability indicates a likelihood that a corresponding external input will be at said logical value;

computing said values based on said second probability.

7. The method of claim 1, wherein said integrated circuit is designed for implementation in a block, said block receiving a plurality of external inputs, wherein said determining comprises:

receiving a plurality of values for said plurality of external inputs; and computing said values based on said plurality of values.

8. A computer readable medium carrying one or more sequences of instructions for causing a system to enable design of an integrated circuit with reduced leakage current, said integrated circuit containing a series of transistors and a corresponding number of input signals, wherein execution of said one or more sequences of instructions by one or more processors contained in said system causes said one or more processors to perform the actions of:

determining a value associated with each of said input signals, each value representing a probability that the corresponding input signal will be at a logical value which turns off a corresponding transistor contained in said series of transistors; and ensuring that a transistor with a high threshold voltage receives an input signal with a high associated value, wherein said input signal is comprised in said input signals and said transistor is comprised in said series of transistors.

9. The computer readable medium of claim 8, wherein said logical value equals 1 when said transistor comprises a PMOS transistor, and equals 0 when said transistor comprises a NMOS transistor.

10. The computer readable medium of claim 8, wherein said transistor is implemented with a high threshold voltage before said determining, wherein said ensuring comprises routing said input signal to be coupled to a gate terminal of said transistor.

11. The computer, readable medium of claim 8, wherein said ensuring comprises implementing said transistor with a high threshold voltage.

12. The computer readable medium of claim 8, wherein said high associated value comprises a highest value.

13. The computer readable medium of claim 8, wherein said integrated circuit is designed for implementation in a block, said block receiving a plurality of external inputs, wherein said determining comprises:

associating a second probability for each of said plurality of external inputs, wherein said second probability indicates a likelihood that a corresponding external input will be at said logical value;

computing said values based on said second probability.

14. The computer readable medium of claim 8, wherein said integrated circuit is designed for implementation in a block, said block receiving a plurality of external inputs, wherein said determining comprises:

receiving a plurality of values for said plurality of external inputs; and computing said values based on said plurality of values.

* * * * *